United States Patent
Jung

(10) Patent No.: US 8,049,196 B2
(45) Date of Patent: Nov. 1, 2011

(54) PHASE-CHANGE MEMORY DEVICE

(75) Inventor: Jin-Ki Jung, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 361 days.

(21) Appl. No.: 12/334,385

(22) Filed: Dec. 12, 2008

(65) Prior Publication Data
US 2009/0250679 A1 Oct. 8, 2009

(30) Foreign Application Priority Data
Apr. 4, 2008 (KR) .................. 10-2008-0031473

(51) Int. Cl.
*H01L 45/00* (2006.01)
(52) U.S. Cl. .................. 257/2; 257/4; 257/E45.002
(58) Field of Classification Search ....... 257/2, E45.002, 257/4
See application file for complete search history.

(56) References Cited

U.S. PATENT DOCUMENTS

| | | | | |
|---|---|---|---|---|
| 7,002,837 B2* | 2/2006 | Morimoto | ............. | 365/148 |
| 7,166,875 B2* | 1/2007 | Gonzalez et al. | ............. | 257/104 |
| 2003/0003691 A1* | 1/2003 | Dennison et al. | ............. | 438/466 |
| 2006/0108639 A1* | 5/2006 | Cho et al. | ............. | 257/368 |
| 2006/0151771 A1 | 7/2006 | Asano et al. | | |
| 2007/0091673 A1* | 4/2007 | Asao et al. | ............. | 365/171 |
| 2007/0249083 A1 | 10/2007 | Li et al. | | |
| 2008/0014733 A1* | 1/2008 | Liu | ............. | 438/597 |
| 2010/0061132 A1* | 3/2010 | Fujisaki et al. | ............. | 365/51 |

FOREIGN PATENT DOCUMENTS

| | | |
|---|---|---|
| JP | 2007-288083 | 1/2007 |
| JP | 2007-035683 | 2/2007 |
| KR | 10-2009-0002548 | 1/2009 |

OTHER PUBLICATIONS

English Translation of Korean Notice of Allowance for application No. 10-2008-0031473.
English Translation of Korean Office Action for Korean Patent Application No. 10-2008-0031473.

* cited by examiner

*Primary Examiner* — Jerome Jackson, Jr.
*Assistant Examiner* — Paul Budd
(74) *Attorney, Agent, or Firm* — Lowe Hauptman Ham & Berner LLP

(57) ABSTRACT

A phase-change memory device includes a lower electrode; and at least two phase-change memory cells sharing the lower electrode. Another phase-change memory device includes a heating layer having a smaller contact area with a phase-change material layer and a greater contact area with a PN diode structure.

5 Claims, 16 Drawing Sheets

PHASE-CHANGE MEMORY DEVICE

CROSS-REFERENCE TO RELATED APPLICATIONS

The present application claims priority of Korean patent application number 10-2008-0031473, filed on Apr. 4, 2008, which is incorporated herein by reference in its entirety.

BACKGROUND

The disclosure relates to a nonvolatile memory device, and more particularly, to a phase-change nonvolatile memory device using a phase-change material and a method of fabricating the same.

Recently, a Phase-change Random Access Memory (PRAM) device has been proposed as a nonvolatile semiconductor memory device. A unit memory cell of a phase-change memory device uses a phase-change material as a data storage medium. The phase-change material has two stable phases (e.g., an amorphous phase and a crystalline phase) depending on the heat supplied thereto. A known phase-change material is a Ge—Sb—Te (GST) compound that is a mixture of germanium (Ge), antimony (Sb), and Tellurium (Te).

If the phase-change material is heated for a short time at a temperature close to its melting temperature (Tm) and is then cooled quickly, the phase-change material changes from the crystalline phase into the amorphous phase. On the contrary, if the phase-change material is heated for a long time at a crystallization temperature lower than the melting temperature and is then cooled slowly, the phase-change material changes from the amorphous phase to the crystalline phase. The phase-change material has a higher resistivity in the amorphous phase than in the crystalline phase. Thus, whether data stored in a phase-change memory cell is logical '1' or logical '0' can be determined by detecting a current flowing through the phase-change material.

Heat is supplied to effect a phase-change in the phase-change material. For example, a current is supplied to an electrode connected with the phase-change material, so that heat is generated from the electrode and supplied to the phase-change material. The temperature caused by the heat supplied to the phase-change material varies depending on the supplied current.

Thus, one of the most important factors in development of a high-integration phase-change memory device is to supply a sufficient current to an electrode connected with a phase-change material, that is, an operation current (e.g., a program (write) current or an erase current). To this end, a method has been proposed to use a PN diode as a switching device of the phase-change memory device. A PN diode allows a higher integration ratio of the phase-change memory device and increases the operation current in comparison with a Metal-Oxide-Semiconductor (MOS) transistor or a bipolar transistor.

FIG. 1A is a schematic plan view of a known phase-change memory device using a PN diode. FIG. 1B is a cross-sectional view of the phase-change memory device taken along line X-X' of FIG. 1A.

Referring to FIGS. 1A and 1B, the known phase-change memory device includes: a substrate 11 having a device isolation region (not numbered) and an active region 12, a lower electrode 13 having a PN diode structure including a stack of an N-type silicon layer 13A and a P-type silicon layer 13B on the substrate 11 of the active region 12, an insulating layer 14 covering the lower electrode 13 and burying a heating layer 15, a phase-change material layer 16 disposed on the insulating layer 14 to contact the heating layer 15, and an upper electrode 17 disposed on the phase-change material layer 16. The heating layer 15 is plug-shaped, and a program region 18 of a hemispheric shape is formed in the phase-change material layer 16 in contact with the heating layer 15.

The size of the phase-change memory device is desirably reduced for high integration and low power consumption of the phase-change memory device. However, a sufficiently high operation current is required because high-temperature heat should be generated to change the phase of the phase-change material layer 16. Accordingly, there is a limit in reducing the size of the lower electrode 13 (i.e., the size of the PN diode) that controls the operation current.

Accordingly, a method has been proposed to reduce the operation current of the phase-change memory device with the above-described structure by reducing the contact area between the heating layer 15 and the phase-change material layer 16 by reducing the size of the heating layer 15. This method can generate high-temperature heat even in the event of a decrease in the operation current, because the resistance of the heating layer 15 increases with a decrease in the contact area between the phase-change material layer 16 and the heating layer 15.

However, the known method uses an expensive fine patterning technology (e.g., a photolithography process using an ArF exposure source) to form the heating layer 15. This increases the fabrication cost of the phase-change memory device. Moreover, the fine patterning technology has a limitation in that it is difficult to increase the integration ratio of the phase-change memory device.

SUMMARY

In accordance with one or more embodiments, a phase-change memory device comprises: a lower electrode; and at least two phase-change memory cells sharing the lower electrode.

In accordance with one or more embodiments, a method of fabricating a phase-change memory device comprises: forming a lower electrode comprising a PN diode structure including a junction of an N-type conductive layer and a P-type conductive layer; forming a plurality of heating elements on an upper one of the P-type conductive layer and the N-type conductive layer; selectively etching the upper one of the P-type conductive layer and the N-type conductive layer between the heating elements; forming a separated phase-change material layer on each of the heating elements; and forming a separated upper electrode on each phase-change material layer.

In accordance with one or more embodiments, a method of fabricating a phase-change memory device comprises: forming a lower electrode comprising a PN diode structure on an active region of a substrate; forming a heating layer on the PN diode structure; forming a phase-change material layer on the heating layer; and forming an upper electrode on the phase-change material layer; wherein a contact area between the phase-change material layer and the heating layer is formed to be smaller than that between the heating layer and the PN diode structure.

In accordance with one or more embodiments, a phase-change memory device comprises: a substrate having thereon an active region; a lower electrode comprising a PN diode structure on the active region of the substrate; a heating layer on the PN diode structure; a phase-change material layer on the heating layer; and an upper electrode on the phase-change material layer; wherein a contact area between the phase-change material layer and the heating layer is smaller than that between the heating layer and the PN diode structure.

BRIEF DESCRIPTION OF THE DRAWINGS

Various embodiments are illustrated by way of example, and not by limitation, in the figures of the accompanying drawings, wherein elements having the same reference numeral designations represent like elements throughout.

DESCRIPTION OF EMBODIMENTS

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, or one or more intervening layers may also be present. In addition, it will also be understood that when a layer is referred to as being 'between' two layers, it can be the only layer between the two layers, or one or more intervening layers may also be present.

Figure 1A:
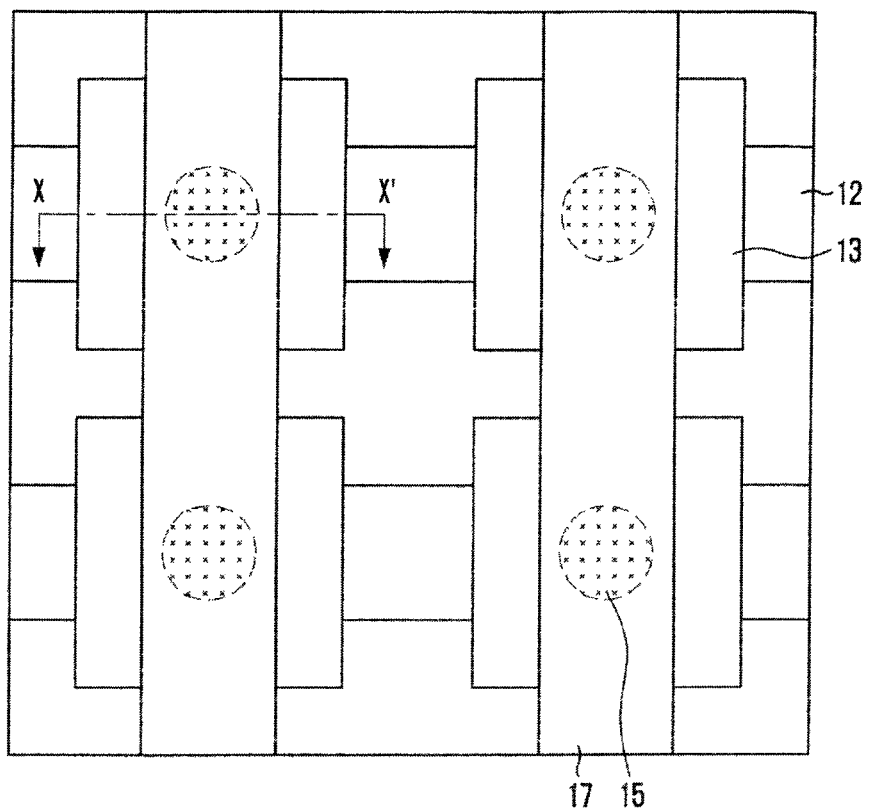
FIG. 1A is a schematic plan view of a known phase-change memory device using a PN diode.
Figure 1B:
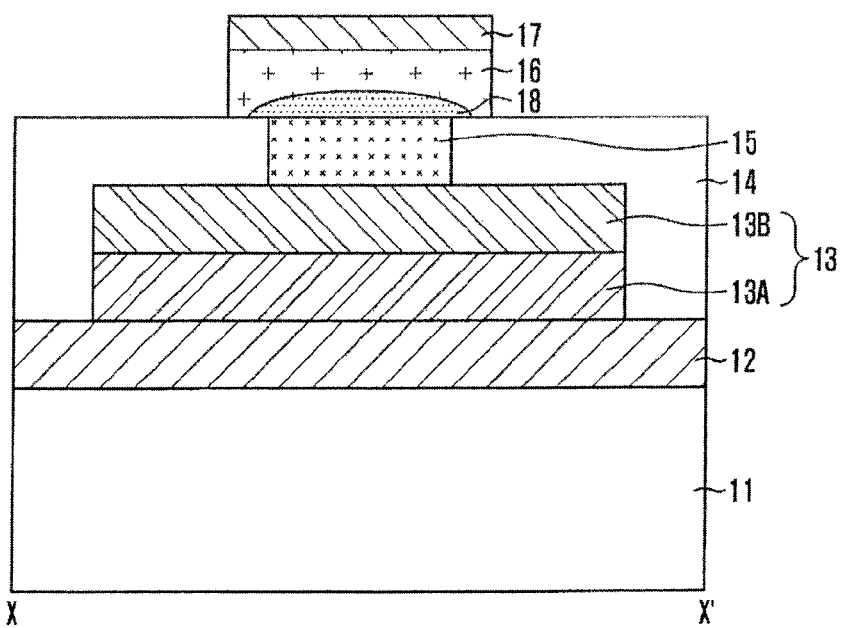
FIG. 1B is a cross-sectional view of the phase-change memory device taken along line X-X' of FIG. 1A.
Figure 2A:
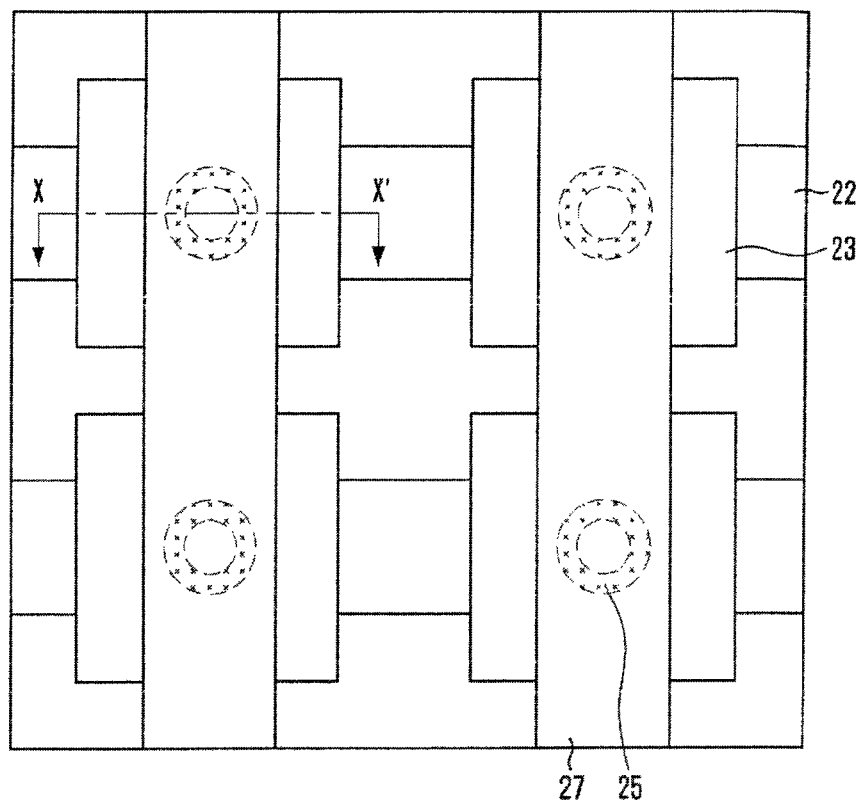
FIG. 2A is a schematic plan view of a phase-change memory device in accordance with a first embodiment.
Figure 2B:
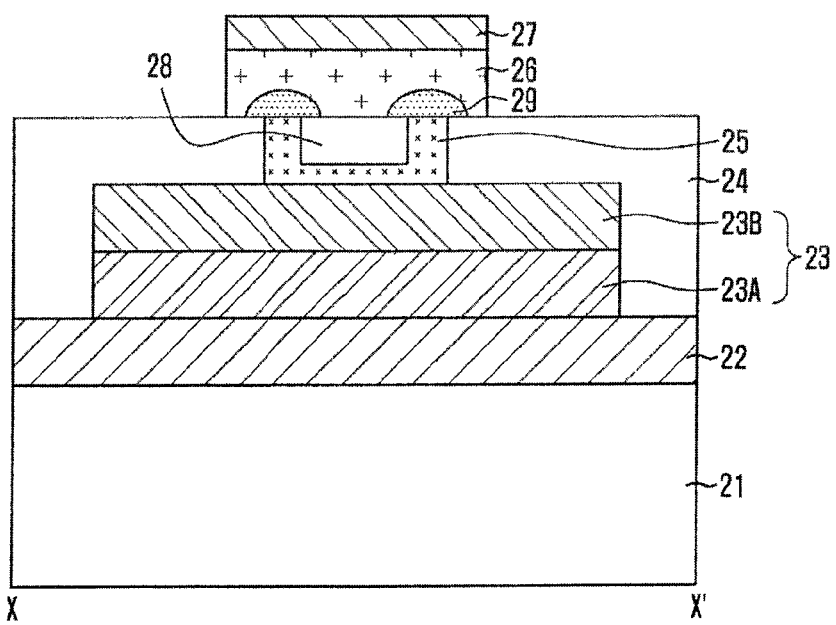
FIG. 2B is a cross-sectional view of the phase-change memory taken along line X-X' of FIG. 2A.

FIG. 2A is a schematic plan view of a phase-change memory device in accordance with a first embodiment. FIG. 2B is a cross-sectional view of the phase-change memory taken along line X-X' of FIG. 2A.

Referring to FIGS. 2A and 2B, a phase-change memory device in accordance with a first embodiment includes: a substrate 21 having a device isolation region (not numbered) and an active region 22, a first insulating layer 24 covering the substrate 21, a lower electrode 23 disposed on the substrate 21 of the active region 22 in the first insulating layer 24 and having a PN diode structure; a heating layer 25 disposed on the lower electrode 23 in the first insulating layer 24, a second insulating layer 28 buried in the heating layer 25, a phase-change material layer 26 disposed to cover the heating layer 25 and an upper electrode 27 disposed on the phase-change material layer 26. Herein, a reference numeral 29 denotes a program region that is disposed in the phase-change material layer 26.

The substrate 21 may be a silicon (Si) substrate.

The active region 22 may be formed in a bar type or a line type. For example, the active region 22 may be an impurity layer that is formed by doping a silicon substrate with impurities. In some embodiments, the active layer 22 is formed of an N-type impurity layer that is doped with N-type impurities such as phosphor (P) or arsenic (As). This is to reduce the potential barrier between the lower electrode 23 (i.e., the PN diode) and the active region 22 acting as one of a word line and a bit line, thus increasing the electrical conductivity therebetween. Herein, the remaining region of the substrate 21 outside the active region 22 is referred to as the device isolation region.

The lower electrode 23 has a PN diode structure that includes a junction of an N-type conductive layer 23A disposed on the active region 22 of the substrate 21 and a P-type conductive layer 23B disposed on the N-type conductive layer 23A. The N-type conductive layer 23A and the P-type conductive layer 23B may be a silicon layer, and the silicon layer may include a polysilicon (poly-Si) layer and/or an epitaxial silicon layer. For example, the N-type conductive layer 23A may be an N-type silicon layer doped with N-type impurities, and the P-type conductive layer 23B may be a P-type silicon layer doped with P-type impurities. The N-type impurities may be phosphor (P) or arsenic (As), and the P-type impurities may be boron (B).

In some embodiments, the lower electrode 23 is formed in such a way that the impurity doping concentration of the N-type conductive layer 23A is lower than the impurity doping concentration of the P-type conductive layer 23B. The reason for this is that the potential barrier between the N-type conductive layer 23A and the P-type conductive layer 23B becomes low if the impurity doping concentration of the N-type conductive layer 23A is higher than the impurity doping concentration of the P-type conductive layer 23B. If the potential barrier between the N-type conductive layer 23A and the P-type conductive layer 23B is low, the threshold voltage of the PN diode becomes low and thus data may be written in an undesired phase-change memory cell by a high voltage of the wordline (i.e., the active region) in a stand-by mode. This problem can be avoided or at least reduced, by increasing the threshold voltage of the PN diode by forming the lower electrode 23 in such a way that that the impurity doping concentration of the N-type conductive layer 23A is lower than the impurity doping concentration of the P-type conductive layer 23B.

The heating layer 25 and the upper electrode 27 may be formed of a metal material or a metal-compound material. The metal material may be titanium (Ti), tungsten (W), copper (Cu), or aluminum (Al). The metal-compound material may be titanium nitride (TiN), tungsten nitride (WN), titanium aluminum nitride (TiAlN), or titanium tungsten (TiW).

Also, the contact area between the phase-change material layer 26 and the heating layer 25 can be controlled according to the deposition thickness of the heating layer 25. Thus, the operation current of the phase-change memory device can be controlled according to the deposition thickness of the heating layer 25. For reference, the known method controls the size of the plug-type heating layer 15 by an etching process through patterning, thus making it difficult to reduce the contact area between the phase-change material layer 16 and the plug-type heating layer 15. However, the contact area between the phase-change material layer 26 and the heating layer 25 can be controlled by controlling the deposition thickness of the heating layer 25 in accordance with the first embodiment not by an etching process through patterning, but by a layer growth/deposition process, thus making it possible to control the contact area between the phase-change material layer 26 and the heating layer 25 more easily.

The phase-change material layer 26 may be formed of a chalcogen compound. The chalcogen compound for the phase-change material layer 26 includes at least one of Germanium-antimony-tellurium (Ge—Sb—Te), arsenic-antimony-tellurium (As—Sb—Te), strontium-antimony-tellurium (Sn—Sb—Te), strontium-indium-tellurium (Sn—In—Sb—Te), arsenic-germanium-antimony-tellurium (As—Ge—Sb—Te), Group 5A element (including tantalum (Ta), niobium (Nb) and vanadium (V))-antimony-tellurium (Group 5A element-Sb—Te), Group 6A element (including tungsten (W), molybdenum (Mo) and chrome (Cr))-antimony-tellurium (Group 6A element-Sb—Te), Group 5A element-antimony-selenium (Group 5A element-Sb—Se), and Group 6A element-antimony-selenium (Group 6A element-Sb—Se). In some embodiments, the phase-change material layer 26 is formed of a Ge—Sb—Te (GST) compound.

The first insulating layer 24 and the second insulating layer 28 may be formed of at least one selected from the group consisting of an oxide layer, a nitride layer, an oxynitride layer, and a stack thereof. The oxide layer may include silicon oxide ($SiO_2$), Boron Phosphorus Silicate Glass (BPSG), Phosphorus Silicate Glass (PSG), Tetra Ethyle Ortho Silicate (TEOS), Un-doped Silicate Glass (USG), Spin On Glass (SOG), High Density Plasma (HDP), or Spin On Dielectric (SOD). The nitride layer may include silicon nitride ($Si_3N_4$). The oxynitride layer may include silicon oxynitride (SiON).

In the configuration specifically depicted in FIG. 2B, the heating layer 25 is formed in a cup shape in the phase-change memory device in accordance with the first embodiment, thereby making it possible to reduce the contact area, which is annular in shape in the specifically illustrated configuration, between the phase-change material layer 26 and the heating layer 25. Accordingly, the size of the program region 29 can be considerably reduced, thus making it possible to reduce the heat needed to be supplied to the program region 29. It should be noted that other arrangements are not excluded. For example, the contact area between the heating layer 25 and the phase-change material layer 26 is not necessarily annular, or the heating layer 25 is not necessarily cup-shaped; it can be cylindrical or tubular instead.

Also, the contact area between the phase-change material layer 26 and the heating layer 25 can be controlled by controlling the deposition thickness of the heating layer 25 as will be described herein below. Thus, the contact area between the heating layer 25 and the phase-change material layer 26 can be reduced even without the use of an expensive fine patterning technology, thereby making it possible to reduce the fabrication cost of the phase-change memory device.

Figure 3A:
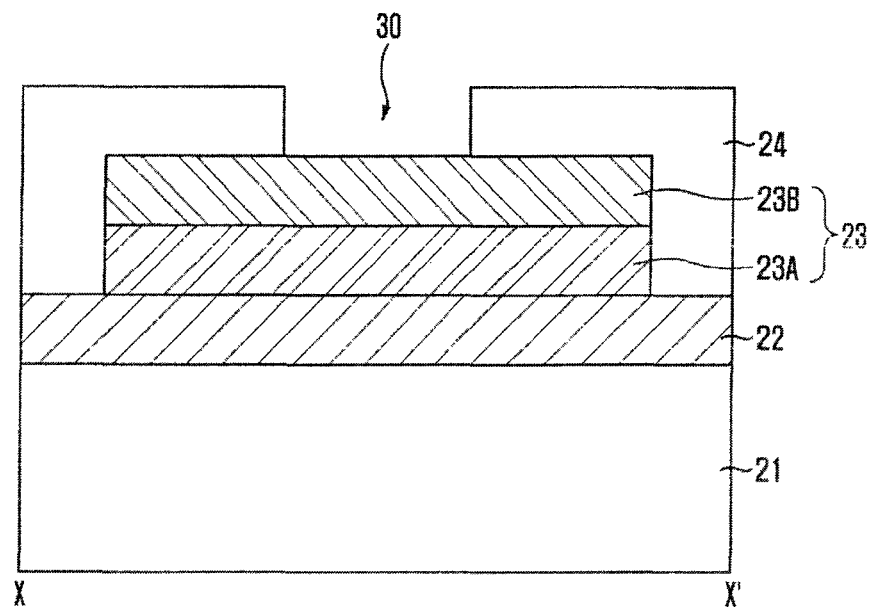
FIGS. 3A to 3C are schematic views that illustrate a method of fabricating a phase-change memory device in accordance with a first embodiment.
Figure 3B:
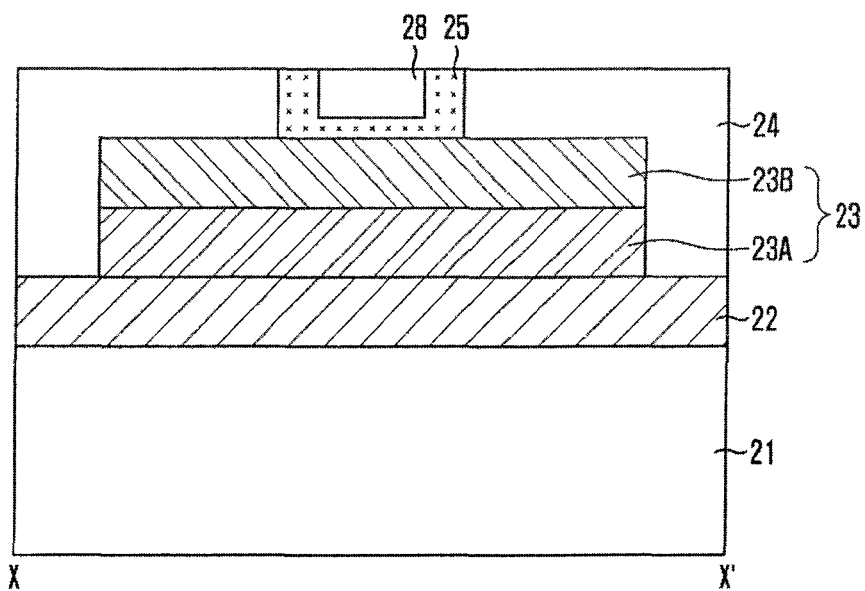
Figure 3C:
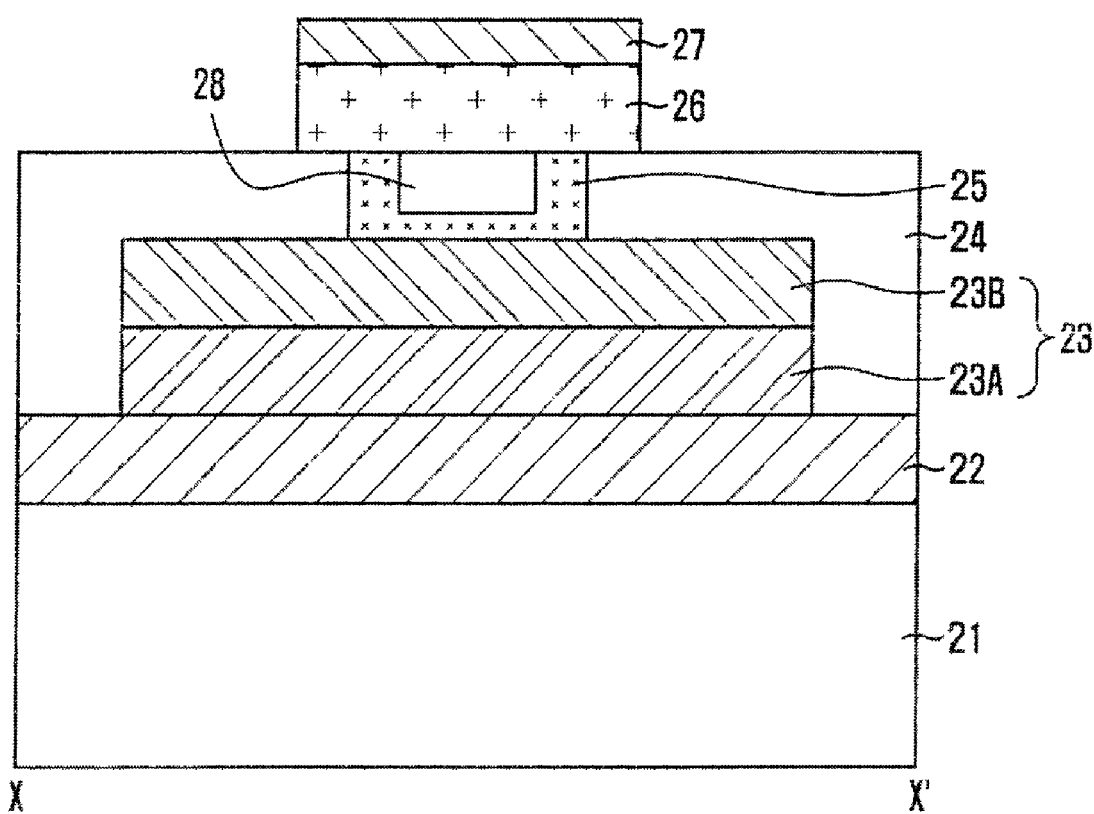

FIGS. 3A to 3C are schematic views that illustrate a method of fabricating a phase-change memory device in accordance with a first embodiment.

Referring to FIG. 3A, impurities are ion-implanted into a substrate 21 to form an active region 22. The impurities may be P-type impurities or N-type impurities. The P-type impurities may be boron (B), and the N-type impurities may be arsenic (As) or phosphor (P). In some embodiments the ion implantation process is performed using N-type impurities. This is to reduce the potential barrier between the active region 22 and a lower electrode 23 (i.e., a PN diode), which is to be formed through the subsequent process, thus increasing the electrical conductivity therebetween.

A predetermined region of the substrate 21 is etched to form a trench (not illustrated) for device isolation, and the trench is filled with an insulating layer to form a device isolation region (not illustrated). The trench may be formed in a line type or a bar type although other arrangements are not excluded. The remaining region of the substrate 21 except the device isolation region is defined as the active region 22, and the active region 22 has a line type or a bar type due to the line type or bar type of the device isolation region.

A lower electrode 23 with a PN diode structure is formed on the substrate 21 of the active region 22. The lower electrode 23 with a PN diode structure may be formed of a stack of an N-type conductive layer 23A and a P-type conductive layer 23B that are sequentially stacked on the active region 22 of the substrate 21. In some embodiments, the lower electrode 23 is formed in such a way that the impurity doping concentration of the N-type conductive layer 23A is lower than the impurity doping concentration of the P-type conductive layer 23B. The reason for this is that, if the impurity doping concentration of the N-type conductive layer 23A is lower than the impurity doping concentration of the P-type conductive layer 23B, the potential barrier between the N-type conductive layer 23A and the P-type conductive layer 23B can be increased to increase the threshold voltage of the PN diode. For reference, the high threshold voltage of a PN diode can prevent a noise-caused malfunction of the PN diode.

The N-type conductive layer 23A and the P-type conductive layer 23B may be formed of a silicon layer, and the silicon layer may include a polysilicon layer or an epitaxial silicon layer. For example, the N-type conductive layer 23A may be formed of an N-type silicon layer doped with N-type impurities, and the P-type conductive layer 23B may be formed of a P-type silicon layer doped with P-type impurities.

For example, the P-type silicon layer may be formed by ion-implanting P-type impurities in situ during the formation of a polysilicon layer through a Chemical Vapor Deposition (CVD) process or a Physical Vapor Deposition (PVD) process, or by ion-implanting P-type impurities after the formation of the polysilicon layer. Also, the P-type silicon layer may be formed by ion-implanting P-type impurities in situ during the formation of an epitaxial silicon layer through an epitaxial growth process, or by ion-implanting P-type impurities after the formation of the epitaxial silicon layer. Also, the P-type silicon layer may be formed by counter-doping P-type impurities into an N-type silicon layer.

A first insulating layer 24 is formed over the resulting structure including the lower electrode 23. The first insulating layer 24 may be formed of at least one selected from the group consisting of an oxide layer, a nitride layer, an oxynitride layer, and a stack thereof.

A photoresist pattern (not illustrated) is formed on the first insulating layer 24. Using the photoresist pattern as an etch barrier, the first insulating layer 24 is etched to form an open region 30 that exposes the top of the P-type conductive layer 23B.

The open region 30 is a region where a heating layer is to be formed through the subsequent process. In the case of the known plug-type heating layer 15, the open region has to be formed with a small width in order to reduce the contact area between the phase-change material layer 16 and the heating layer 15. Therefore, the known method has to form the open region by an expensive fine patterning technology (e.g., a photolithographic etching process using an ArF exposure source), thus increasing the fabrication cost of the phase-change memory device. However, as will be described herein below, the contact area between the phase-change material layer 26 and the heating layer 25 can be reduced even without having to form the open region 30 to have a small width. Thus, the open region 30 can be formed by an etching process using an inexpensive patterning technology, thereby making it possible to reduce the fabrication cost of the phase-change memory device.

Referring to FIG. 3B, a conductive layer for a heating layer is formed, e.g., by a deposition process, over the first insulating layer 24 including the open region 30. The conductive layer for the heating layer may be formed of a metal material or a metal-compound material. The metal material may be titanium (Ti), tungsten (W), copper (Cu), or aluminum (Al). The metal-compound material may be titanium nitride (TiN), tungsten nitride (WN), titanium aluminum nitride (TiAlN), or titanium tungsten (TiW). The contact area between a heating layer 25 and a phase-change material layer 26, which are to be formed through the subsequent processes, may be controlled according to the deposition thickness of the conductive layer for the heating layer.

A second insulating layer 28 is formed to fill a remaining empty space in the open region 30 after the formation, e.g., deposition, of the conductive layer for the heating layer has been completed. The second insulating layer 28 may be formed of at least one selected from the group consisting of an oxide layer, a nitride layer, an oxynitride layer, and a stack thereof.

The second insulating layer 28 and the conductive layer for the heating layer are planarized to expose the top of the first insulating layer 24, thereby forming a heating layer 25. The planarization process may be performed using a Chemical Mechanical Polishing (CMP) process or an etch-back process.

Referring to FIG. 3C, a phase-change material layer 26 and an upper electrode 27 are formed on the first insulating layer 24 and the second insulating layer 28 to cover the heating layer 25. The upper electrode 27 may be formed of the same material as the heating layer 25. That is, the upper electrode 27 may be formed of a metal material or a metal-compound material. The phase-change material layer 26 may be formed using a chalcogen compound such as a Germanium-antimony-tellurium (Ge—Sb—Te, GST) compound.

Although not illustrated in the drawings, a passivation layer is formed in some embodiments on the first insulating layer 24 to cover the upper electrode 27, and a predetermined region of the passivation layer is opened to form an interconnection contact hole and an interconnection, thereby completing the fabrication of the phase-change memory device.

In the description above, the heating layer 25 is formed in a cup shape in the phase-change memory device in accordance with the first embodiment, thereby making it possible to reduce the contact area between the phase-change material layer 26 and the heating layer 25 even without the use of an expensive fine patterning technology. Accordingly, it is possible to reduce the fabrication cost of the phase-change memory device.

Hereinafter, a description will be given of a phase-change memory device and a method of fabricating the same in accordance with a second embodiment, which can further reduce the contact area between a phase-change material layer and a heating layer in comparison with the first embodiment. For the sake of simplicity, a detailed description of the common features between the second embodiment and the first embodiment will be omitted and the following description will focus on the differences between the first and second embodiments.

Figure 4A:
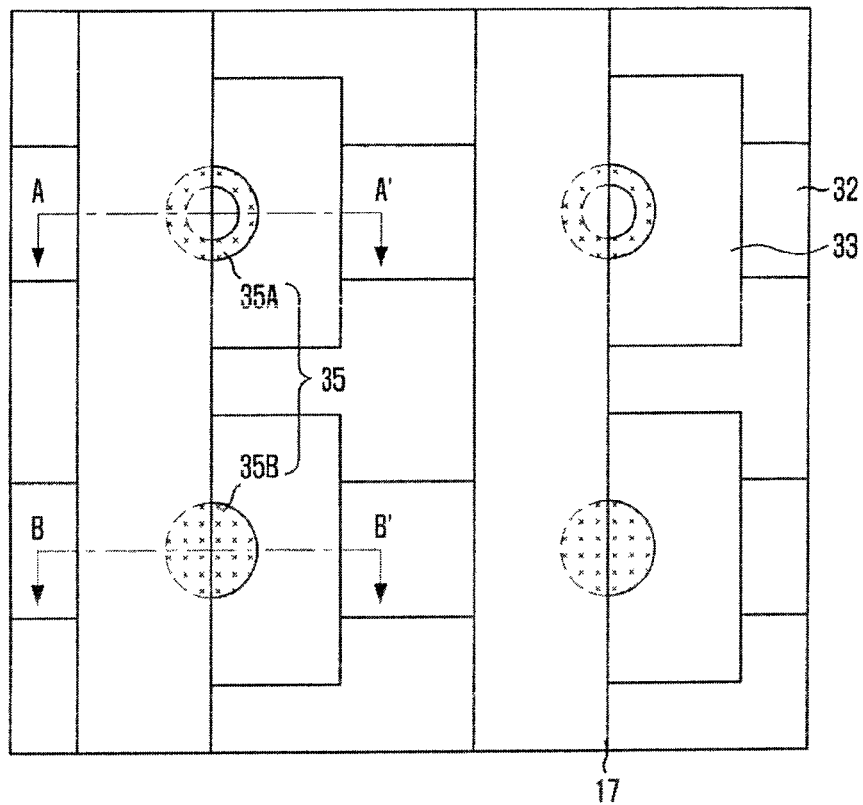
FIG. 4A is a schematic plan view of a phase-change memory device in accordance with a second embodiment.
Figure 4B:
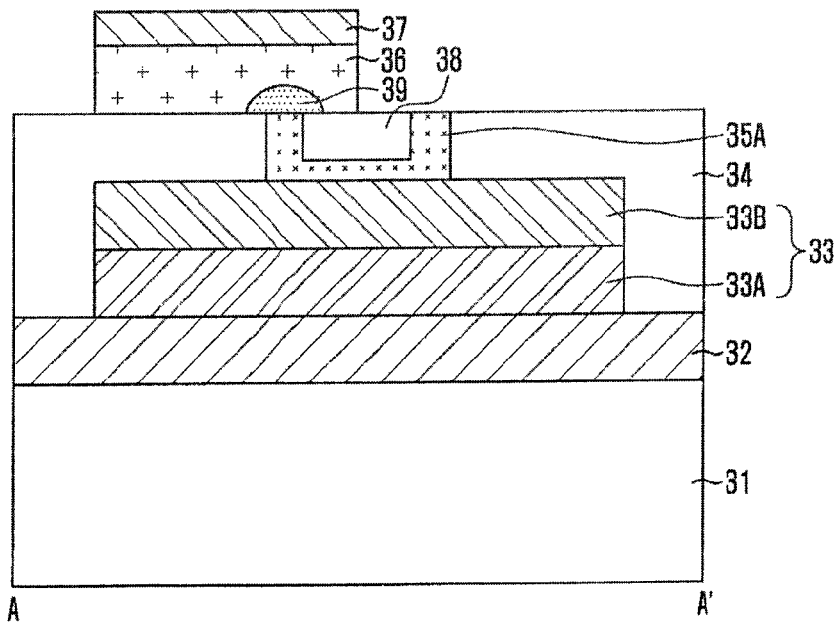
FIG. 4B is a cross-sectional view of the phase-change memory device taken along line A-A' of FIG. 4A.
Figure 4C:
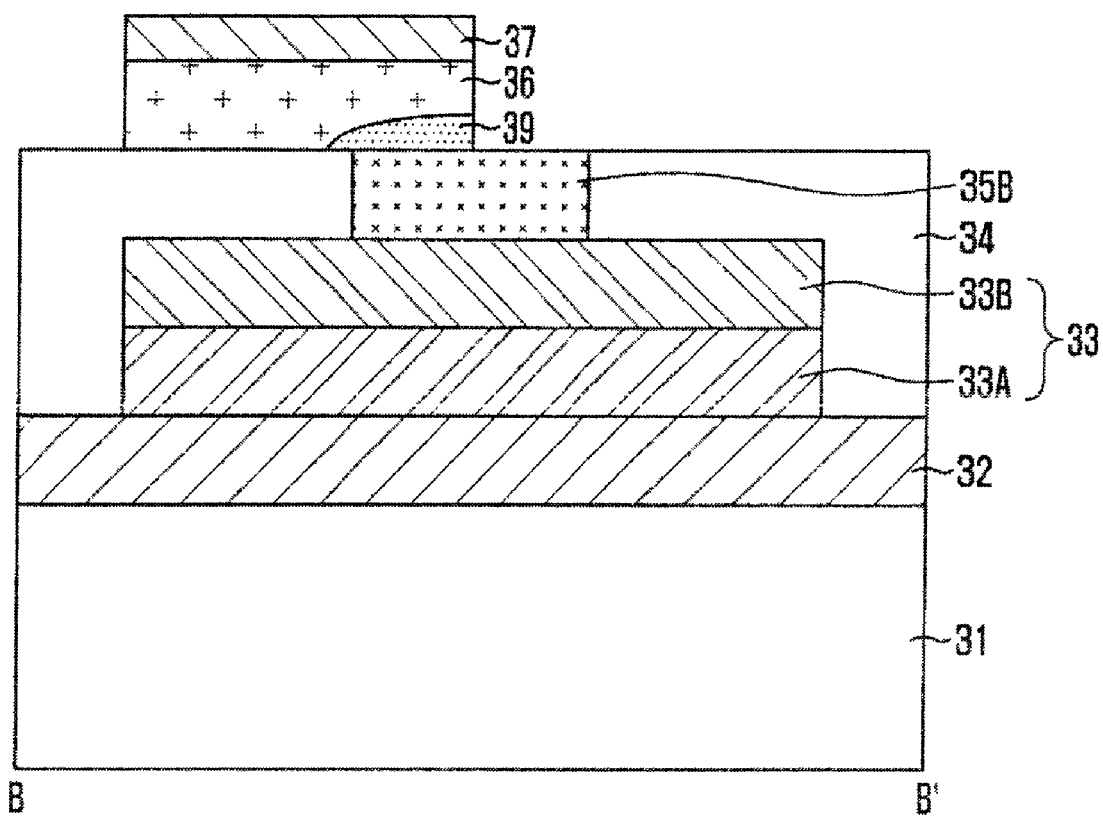
FIG. 4C is a cross-sectional view of the phase-change memory device taken along line B-B' of FIG. 4A.

FIG. 4A is a schematic plan view of a phase-change memory device in accordance with a second embodiment. FIG. 4B is a cross-sectional view of the phase-change memory device taken along line A-A' of FIG. 4A. FIG. 4C is a cross-sectional view of the phase-change memory device taken along line B-B' of FIG. 4A.

Referring to FIGS. 4A to 4C, a phase-change memory device in accordance with a second embodiment includes a substrate 31 having a device isolation region (not numbered) and an active region 32, a first insulating layer 34 covering the substrate 31, a lower electrode 33 disposed on the substrate 31 of the active region 32 in the first insulating layer 34 and having a PN diode structure, a heating layer 35 disposed on the lower electrode 33 in the first insulating layer 34, a phase-change material layer 36 disposed to cover a portion of the heating layer 35 and an upper electrode 37 disposed on the phase-change material layer 36. The heating layer 35 may be formed in a cup type 35A or a plug type 35B. If the heating layer 35 is formed in the cup type 35A, the phase-change memory device may further include a second insulating layer 38 buried in the heating layer 35A. A reference numeral 39 denotes a program region that is disposed in the phase-change material layer 36.

In the description above, the phase-change material layer 36 is disposed to contact only a portion of the exposed top of the heating layer 35 in the phase-change memory device in accordance with the second embodiment, thereby making it possible to further reduce the contact area between the heating layer 35 and the phase-change material layer 36, as will be described below with reference to FIGS. 5A to 5C.

Figure 5A:
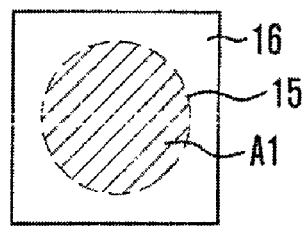
FIGS. 5A to 5C are schematic plan views showing a comparison among the contact area between a phase-change material layer and a heating layer of the known phase-change memory device, the contact area between a phase-change material layer and a heating layer of the phase-change memory device in accordance with the first embodiment, and the contact area between a phase-change material layer and a heating layer of the phase-change memory device in accordance with the second embodiment.
Figure 5B:
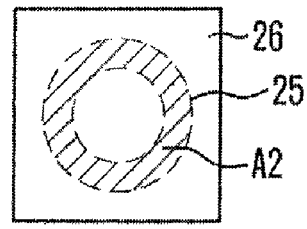
Figure 5C:
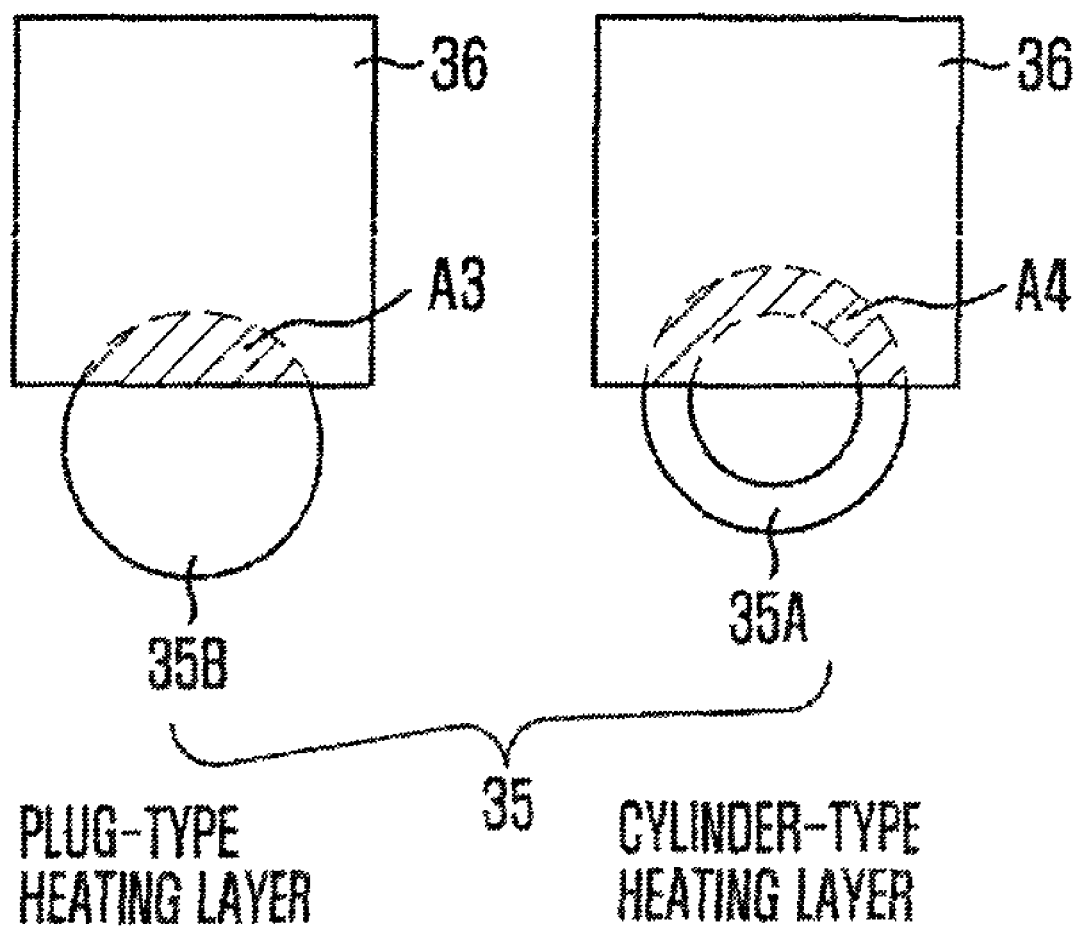

FIGS. 5A to 5C are schematic plan views showing a comparison among the contact area between the phase-change material layer and the heating layer of the known phase-change memory device (see FIG. 5A), the contact area between the phase-change material layer and the heating layer of the phase-change memory device in accordance with the first embodiment (see FIG. 5B), and the contact area between the phase-change material layer and the heating layer of the phase-change memory device in accordance with the second embodiment (see FIG. 5C).

Referring to FIGS. 5A to 5C, it can be seen that the contact area A2 between the phase-change material layer 26 and the cup-type heating layer 25 in accordance with the first embodiment is smaller than the contact area A1 between the phase-change material layer 16 and the known plug-type heating layer 15 (A1>A2).

Also, it can be seen that the contact area A3 between the phase-change material layer 36 and the plug-type heating layer 35B in accordance with the second embodiment is smaller than the contact area A1 between the phase-change material layer 16 and the known plug-type heating layer 15 (A1>A3). Also, it can be seen that the contact area A4 between the phase-change material layer 36 and the cup-type heating layer 35A in accordance with the second embodiment is considerably smaller than the contact area A1 between the phase-change material layer 16 and the known plug-type heating layer 15 (A1>A4).

Also, it can be seen that the contact area A4 between the phase-change material layer 36 and the cup-type heating layer 35A in accordance with the second embodiment is smaller than the contact area A2 between the phase-change material layer 26 and the cup-type heating layer 25 in accordance with the first embodiment (A2>A4).

In the description above, the phase-change material layer 36 is disposed to cover only a portion, not the entirety, of the exposed top of the heating layer 35 in the phase-change memory device in accordance with the second embodiment thereby making it possible to further reduce the contact area between the heating layer 35 and the phase-change material layer 36 in comparison with the first embodiment. Accordingly, it is possible to further reduce the operation current of the phase-change memory device.

A method of fabricating the phase-change memory device in accordance with the second embodiment can be easily derived from the method of fabricating the phase-change memory device in accordance with the first embodiment, which has been described with reference to FIGS. 3A to 3C, and thus its detailed description will be omitted for conciseness.

Hereinafter, a description will be given of a phase-change memory devices and a method of fabricating the same in accordance with third and fourth embodiments, which can reduce the contact area between a heating layer and a phase-change material layer, thereby making it possible to provide a high-integration phase-change memory device while reducing the operation current thereof. To this end, the phase-change memory devices in accordance with the third and fourth embodiments are configured in such a way that two phase-change memory cells share one lower electrode. The lower electrode includes a PN diode, and each phase-change memory cell includes a heating layer, a phase-change material layer, and an upper electrode. For the sake of convenience, a detailed description of the common features between the third/fourth embodiment and the first/second embodiment will be omitted and the following description will focus on the differences between the embodiments.

Figure 6A:
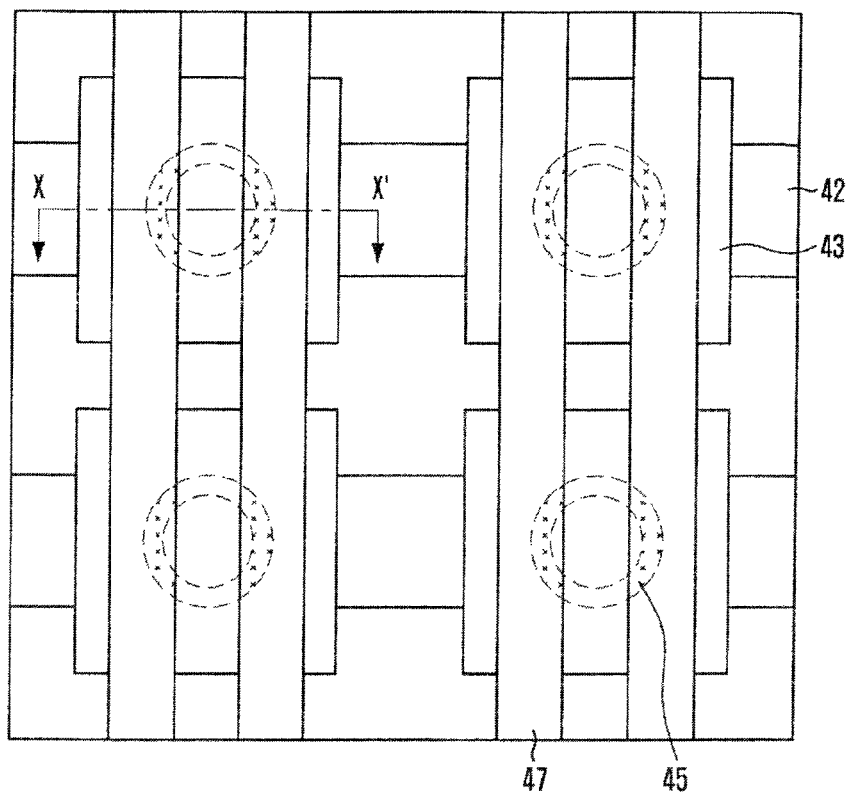
FIG. 6A is a schematic plan view of a phase-change memory device in accordance with a third embodiment.
Figure 6B:
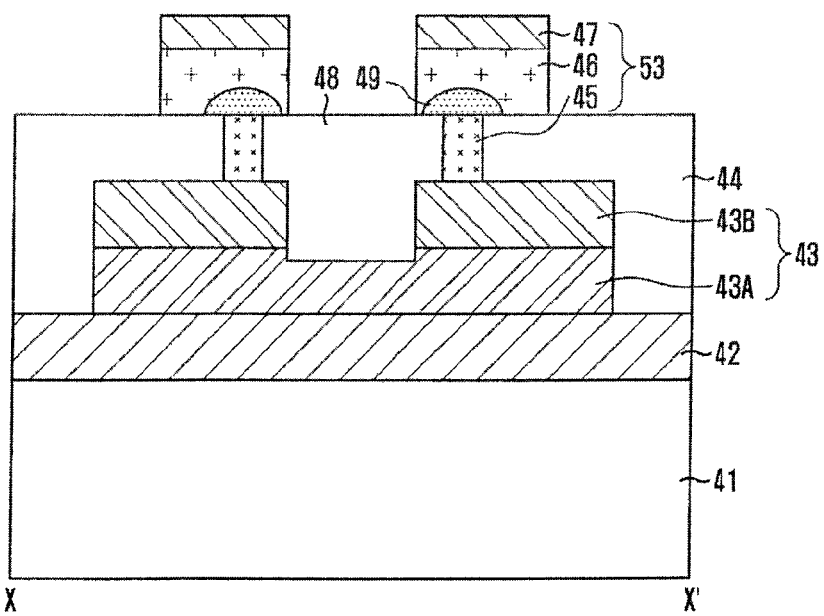
FIG. 6B is a cross-sectional view of the phase-change memory device taken along line X-X' of FIG. 6A.

FIG. 6A is a schematic plan view of a phase-change memory device in accordance with a third embodiment. FIG. 6B is a cross-sectional view of the phase-change memory device taken along line X-X' of FIG. 6A.

Referring to FIGS. 6A and 6B, a phase-change memory device in accordance with a third embodiment includes a substrate 41 having a device isolation region (not numbered) and an active region 42, a first insulating layer 44 covering the substrate 41, a lower electrode 43 disposed on the active region 42 and having a shared region and two isolated regions, and two phase-change memory cell 53 each disposed on one of the isolated regions of the lower electrode 43. Each phase-change memory cell 53 includes a heating layer 45 disposed on the respective isolated region of the lower electrode 43, a phase-change material layer 46 disposed to cover the heating layer 45, and an upper electrode 47 disposed on the phase-change material layer 46. The phase-change memory device may further include a second insulating layer 48 buried between the isolated regions of the lower electrode 43 and the heating layer 45. A reference numeral 49 denotes a program region that is disposed in the phase-change material layer 46.

The shared region in the lower electrode 43 is formed of an N-type conductive layer 43A, and the isolated region in the lower electrode 43 is formed of a junction of the N-type conductive layer 43A and a P-type conductive region 43B.

That is, the lower electrode 43 includes multiple, at least two, PN diodes each of which has a junction of the N-type conductive layer 43A and the P-type conductive layer 43B in the respective isolated region, and multiple, at least two, phase-change memory cells 53 share the N-type conductive layer 43A. The P-type conductive layer 43B is electrically connected with the respective phase-change memory cell 53.

The heating layer 45 may have a plug shape or a cup-shape. Other arrangements are, however, not excluded.

In the description above, two phase-change memory cells 53 share one lower electrode 43 in the phase-change memory device in accordance with the third embodiment, thus making it possible to considerably increase the integration ratio of the phase-change memory device. That is, the third embodiment can increase the integration ratio of the phase-change memory device two or more times in comparison with the first and second embodiments.

Also, the third embodiment can increase the integration ratio of the phase-change memory device and can also reduce the contact area between the phase-change material layer 46 and the heating layer 45, thereby making it possible to reduce the required operation current of the phase-change memory device as will be discussed in the following description of a method of fabricating the phase-change memory device in accordance with the third embodiment, with reference to FIGS. 7A to 7H.

FIGS. 7A to 7H are schematic views that illustrate a method of fabricating a phase-change memory device in accordance with a third embodiment. FIGS. 7A, 7C, 7E and 7G are schematic plan views and FIGS. 7B, 7D, 7F and 7H are cross-sectional views taken along line X-X' of the plan views, respectively.

Figure 7A:
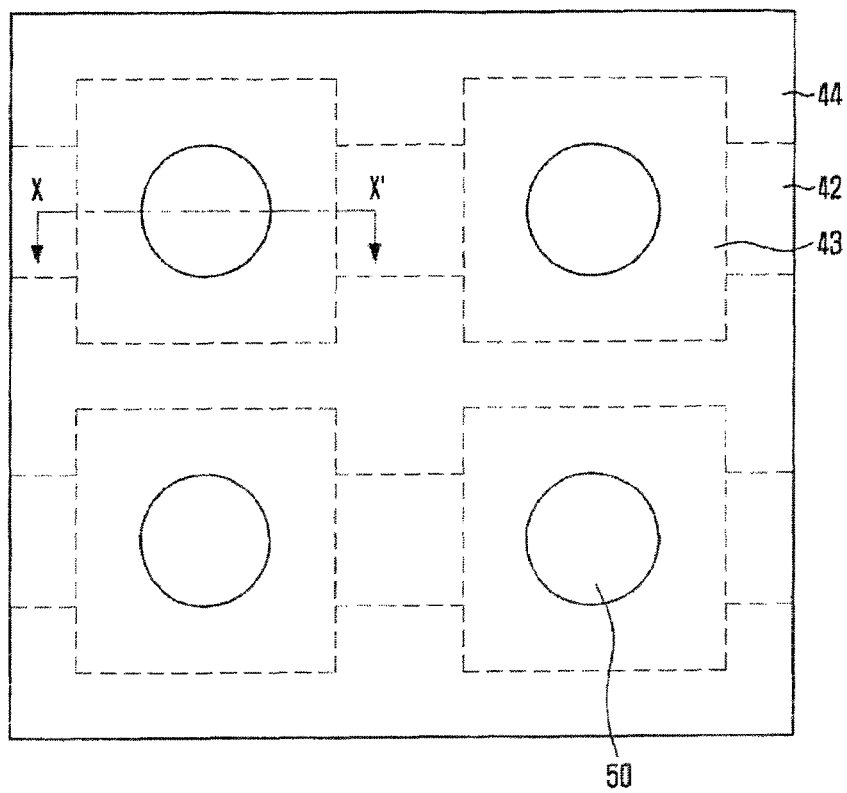
FIGS. 7A to 7H are schematic views that illustrate a method of fabricating a phase-change memory device in accordance with a third embodiment.
Figure 7B:
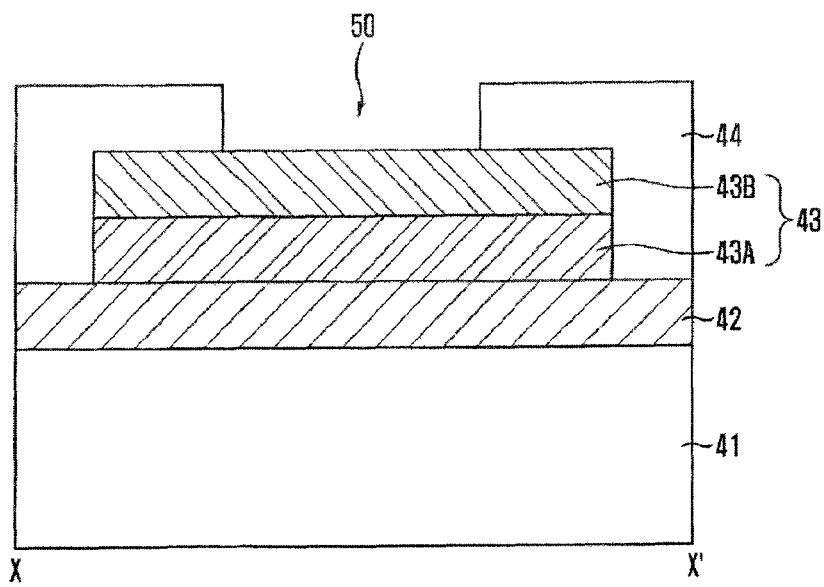

Referring to FIGS. 7A and 7B, impurities are ion-implanted into a substrate 41 to form an active region 42. The impurities may be P-type impurities or N-type impurities. The P-type impurities may be boron (B), and the N-type impurities may be arsenic (As) or phosphor (P). In some embodiments the ion implantation process is performed using N-type impurities. This is to reduce the potential barrier between the active region 42 and the lower electrode 43, which is to be formed through the subsequent process, thus increasing the electrical conductivity therebetween.

A predetermined region of the substrate 41 is etched to form a trench (not illustrated) for device isolation, and the trench is filled with an insulating layer to form a device isolation region (not illustrated). The trench may be formed in a line type or a bar type although other arrangements are not excluded. The remaining region of the substrate 41 outside the device isolation region is defined as the active region 42, and the active region 42 has a line type or a bar type due to the line type or bar type of the device isolation region.

A lower electrode 43 with a PN diode structure is formed on the active region 42. The PN diode structure may be formed of a stack of an N-type conductive layer 43A and a P-type conductive layer 43B that are sequentially stacked on the active region 42 of the substrate 41. In some embodiments, the lower electrode 43 is formed in such a way that the impurity doping concentration of the N-type conductive layer 43A is lower than the impurity doping concentration of the P-type conductive layer 43B. The reason for this is that the threshold voltage of the PN diode can be increased if the impurity doping concentration of the N-type conductive layer 43A is lower than the impurity doping concentration of the P-type conductive layer 43B. For reference, the high threshold voltage of a PN diode can prevent a noise-caused malfunction of the PN diode.

The N-type conductive layer 43A and the P-type conductive layer 43B may be formed of a silicon layer, and the silicon layer may include a polysilicon layer or an epitaxial silicon layer. For example, the N-type conductive layer 43A may be formed of an N-type silicon layer doped with N-type impurities, and the P-type conductive layer 43B may be formed of a P-type silicon layer doped with P-type impurities.

For example, the P-type silicon layer may be formed by ion-implanting P-type impurities in situ during the formation of a polysilicon layer through a Chemical Vapor Deposition (CVD) process or a Physical Vapor Deposition (PVD) process, or by ion-implanting P-type impurities after the formation of the polysilicon layer. Also, the P-type silicon layer may be formed by ion-implanting P-type impurities in situ during the formation of an epitaxial silicon layer through an epitaxial growth process, or by ion-implanting P-type impurities after the formation of the epitaxial silicon layer. Also, the P-type silicon layer may be formed by counter-doping P-type impurities into an N-type silicon layer.

A first insulating layer 44 is formed over the resulting structure including the lower electrode 43. The first insulating layer 44 may be formed of at least one selected from the group consisting of an oxide layer, a nitride layer, an oxynitride layer, and a stack thereof.

A photoresist pattern (not illustrated) is formed on the first insulating layer 44. Using the photoresist pattern as an etch barrier or mask, the first insulating layer 44 is etched to form an open region 50 that exposes the top of the P-type conductive layer 43B.

The open region 50 is a region where a heating layer is to be formed through the subsequent process. In the case of the known plug-type heating layer, the open region has to be formed to have a small width in order to reduce the contact area between the phase-change material layer 16 and the heating layer 15. Therefore, the known method forms the open region by an expensive fine patterning technology (e.g., a photolithographic etching process using an ArF exposure source), thus increasing the fabrication cost of the phase-change memory device. However, since the heating layer 45 can be formed in a cylindrical shape, as will be discussed herein below, and/or the size of the heating layer 45 can be reduced through the subsequent process for isolating the lower electrode 43, the third embodiment can reduce the contact area between the phase-change material layer 46 and the heating layer 45 even without having to form the open region 50 to have a small width. Thus, the open region 50 can be formed by an etching process using an inexpensive patterning technology, thereby making it possible to reduce the fabrication cost of the phase-change memory device.

Figure 7C:
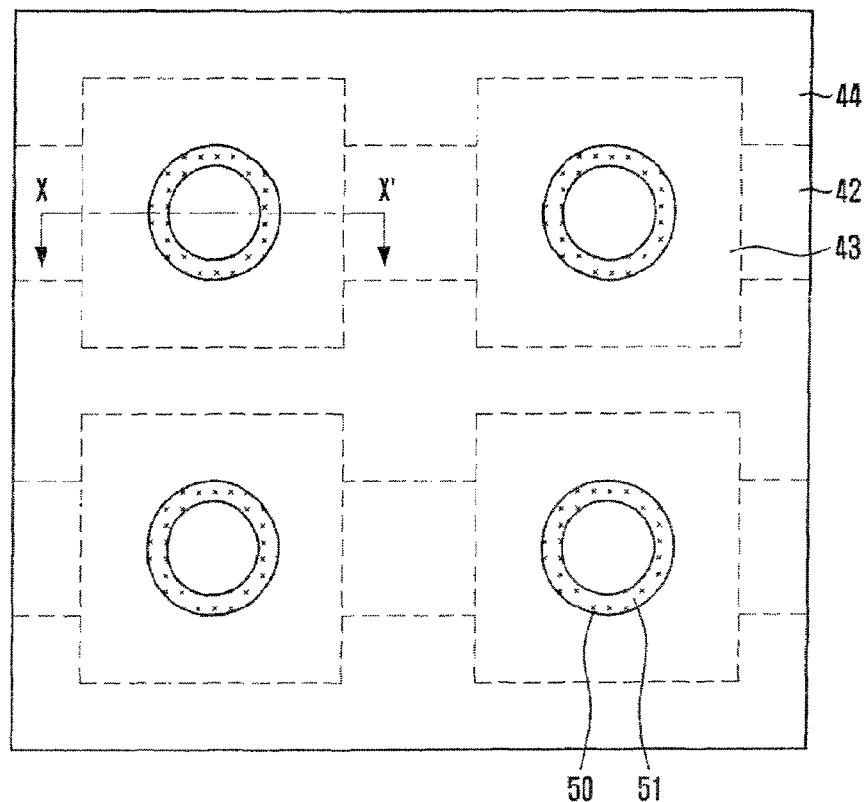
Figure 7D:
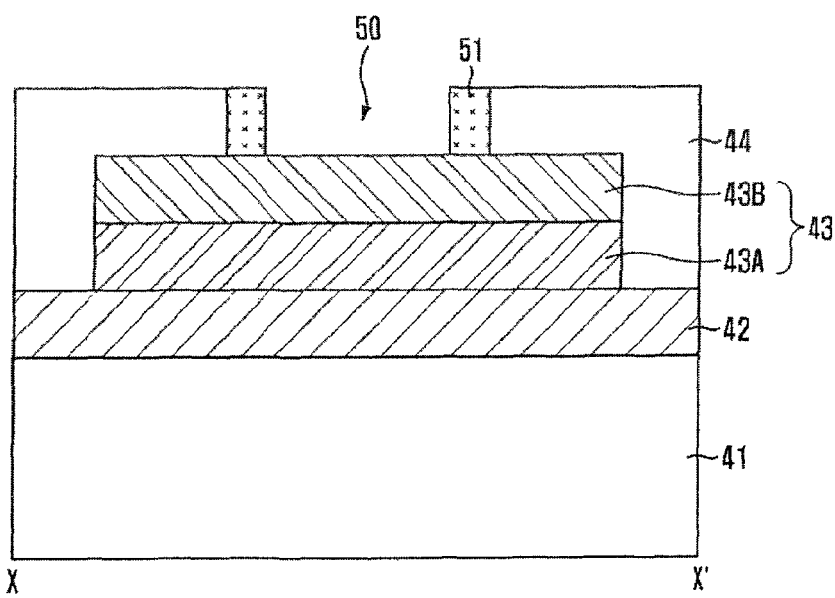

Referring to FIGS. 7C and 7D, a conductive layer 51 for a heating layer is formed over the first insulating layer 44 including the open region 50. The conductive layer 51 for the heating layer may be formed of a metal material or a metal-compound material. The metal material may be titanium (Ti), tungsten (W), copper (Cu), or aluminum (Al). The metal-compound material may be titanium nitride (TiN), tungsten nitride (WN), titanium aluminum nitride (TiAlN), or titanium tungsten (TiW). The contact area between a heating layer and a phase-change material layer, which are to be formed through the subsequent processes, may be controlled according to the deposition thickness of the conductive layer 51 for the heating layer.

A blanket etching process, for example, an etch-back process is performed such that the conductive layer 51 for the heating layer remains only on the sidewall of the open region 50. That is, the remaining conductive layer 51 of the heating layer has a cylindrical shape. Alternatively, unwanted portions of the conductive layer 51 for the heating layer can be removed later during the process(es) of forming the isolated regions as discussed herein below.

Figure 7E:
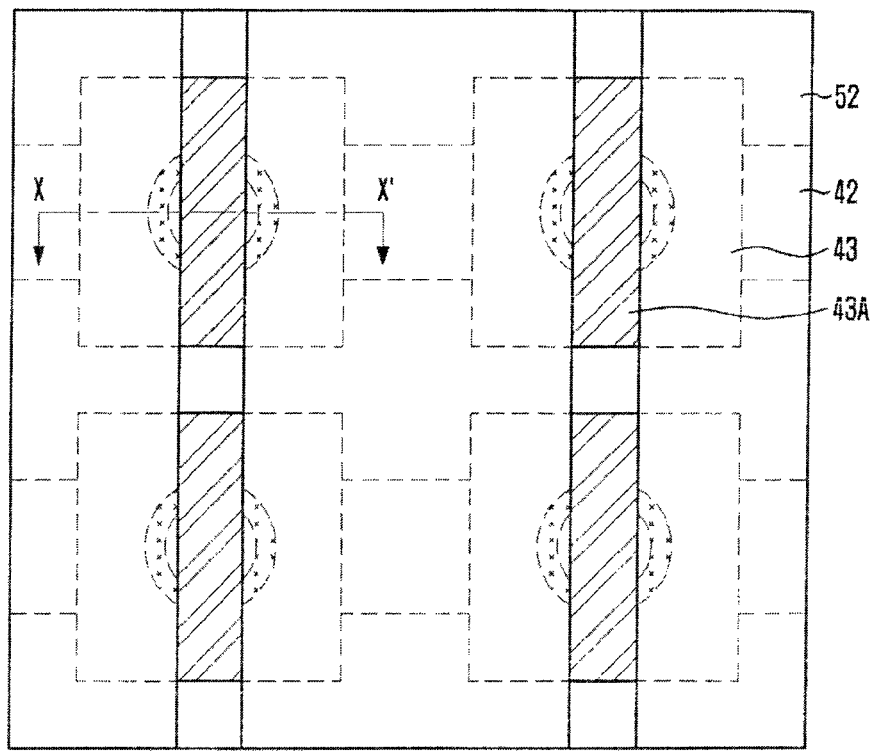
Figure 7F:
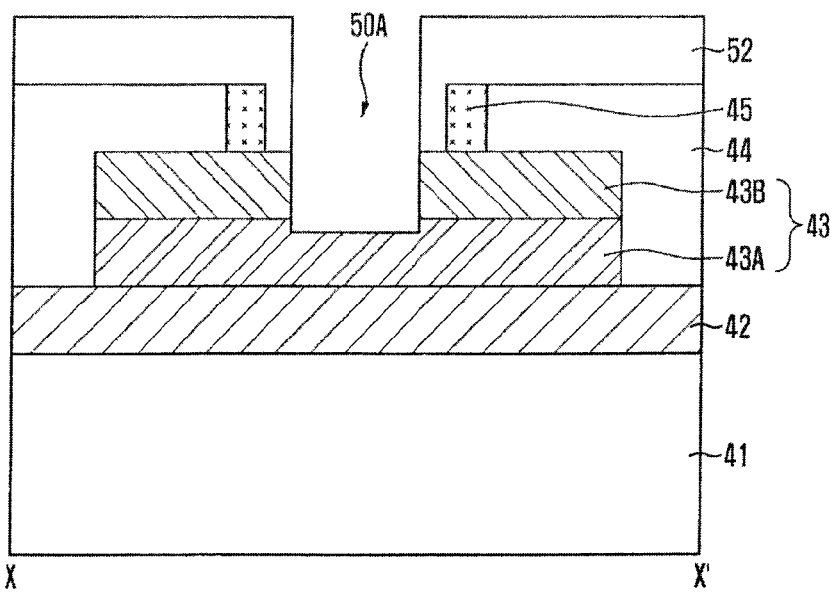

Referring to FIGS. 7E and 7F, a line-type photoresist pattern 52 is formed on the first insulating layer 44 to expose some or all of the empty space in the open region 50 after the formation of the conductive layer 51 for the heating layer. The photoresist pattern 52 may be formed in some embodiments perpendicular to the line-type active region 42. A portion of the conductive layer 51 remaining on the sidewall of the open region 50 is also exposed by the photoresist pattern 52.

Using the photoresist pattern 52 as an etch barrier or mask, the P-type conductive layer 43B of the exposed lower electrode 43 and the exposed conductive layer 51 for the heating layer are etched to form a heating layer 45 and also form the shared and isolated regions in the lower electrode 43. An over-etch process may be performed to etch a portion of the N-type conductive layer 43A in order to completely isolate the P-type conductive layer 43B in two isolated regions of the lower electrode 43.

The lower electrode 43 including a shared region and two isolated regions is formed through the above etching process. The shared region is formed of the N-type conductive layer 43A at the bottom of an expanded open region 50A obtained as a result of the etching process as shown in FIG. 7F. The two isolated regions are formed of the isolated portions of P-type conductive layer 43B and the underlying N-type conductive layer 43A. That is, through the above etching process, the lower electrode 43 may be formed such that it includes a pair of PN diodes having a junction of the N-type conductive layer 43A and the P-type conductive layer 43B, and the N-type conductive layers 43A of the PN diodes are connected with each other.

Also, the heating layer 45 may have a plug shape through the above etching process.

The etching process for forming the heating layer 45 and the lower electrode 43 having the shared region and the isolated regions may be performed using a dry etch process or a wet etch process. The dry etch process may be performed using the plasma of a mixture of chlorine gas ($Cl_2$) and argon gas (Ar), and the wet etch process may be performed using the solution of a mixture of sulfuric acid ($H_2SO_4$) and peroxide ($H_2O_2$) or the solution of a mixture of ammonium hydroxide ($NH_4OH$) and peroxide ($H_2O_2$).

Herein, the open region 50 exposing the top of the N-type conductive layer 43A in the shared region through the above etching process is referred to as the expanded open region 50A.

Figure 7G:
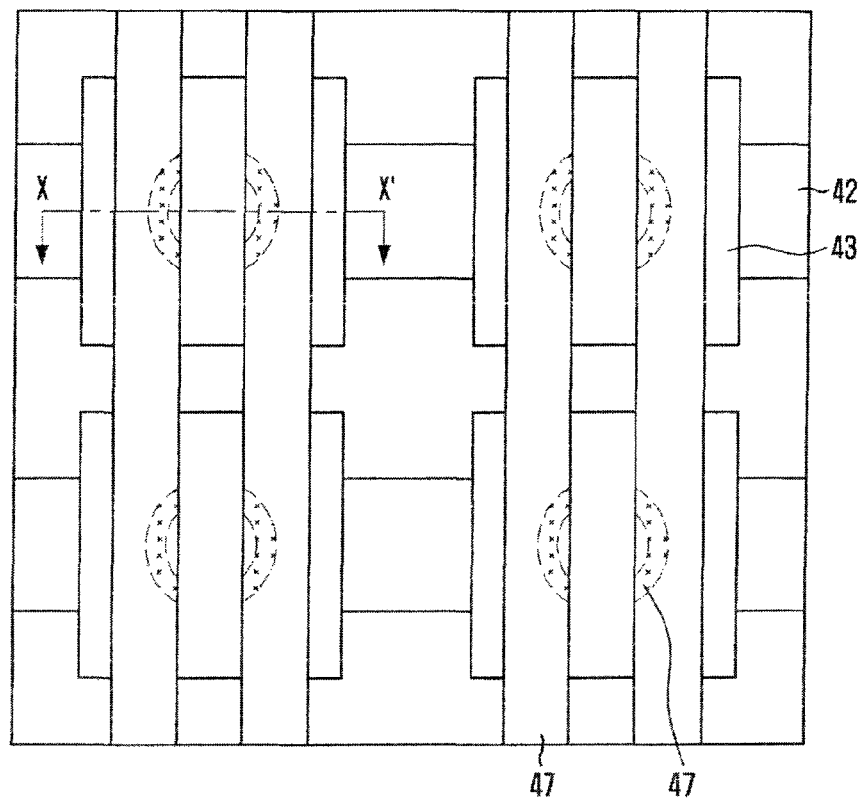
Figure 7H:
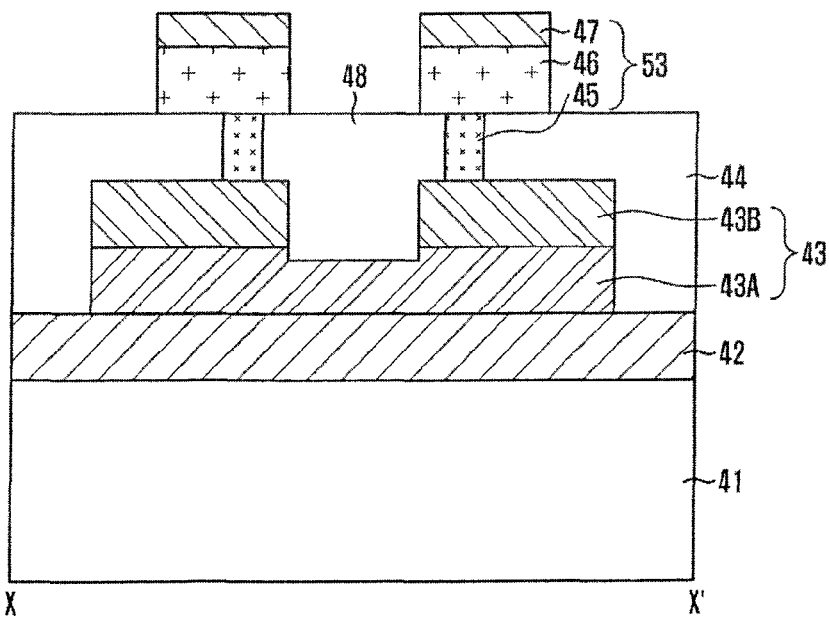

Referring to FIGS. 7G and 7H, the photoresist pattern 52 is removed. The photoresist pattern 52 may be removed through a stripping process.

A second insulating layer 48 is formed to fill an empty space in the expanded open region 50A. The second insulating layer 48 may be formed of at least one selected from the group consisting of an oxide layer, a nitride layer, an oxynitride layer, and a stack thereof.

The second insulating layer 48 is planarized to expose the tops of the heating layer 45 and the first insulating layer 44. The planarization process may be performed using a Chemical Mechanical Polishing (CMP) process or an etch-back process.

A phase-change material layer 46 and an upper electrode 47 are formed on the first insulating layer 44 and the second insulating layer 48 to cover the heating layer 45. The upper electrode 47 may be formed of the same material as the heating layer 45. That is, the upper electrode 47 may be formed of a metal material or a metal-compound material.

The phase-change material layer 46 may be formed using a chalcogen compound such as a Germanium-antimony-tellurium (Ge—Sb—Te, GST) compound.

Through the above processes, the phase-change memory device can be formed such that two phase-change memory cells 53 share one lower electrode 43.

Although not illustrated in the drawings, a passivation layer is formed in some embodiments on the first insulating layer 44 and the second insulating layer 48 to cover the upper electrode 47, and a predetermined region of the passivation layer is opened to form an interconnection contact hole and an interconnection, thereby completing the fabrication of the phase-change memory device.

In the description above, the phase-change memory device in accordance with the third embodiment is formed such that multiple, at least two, phase-change memory cells 53 share one lower electrode 43, thereby making it possible to considerably increase the integration ratio of the phase-change memory device.

Figure 8A:
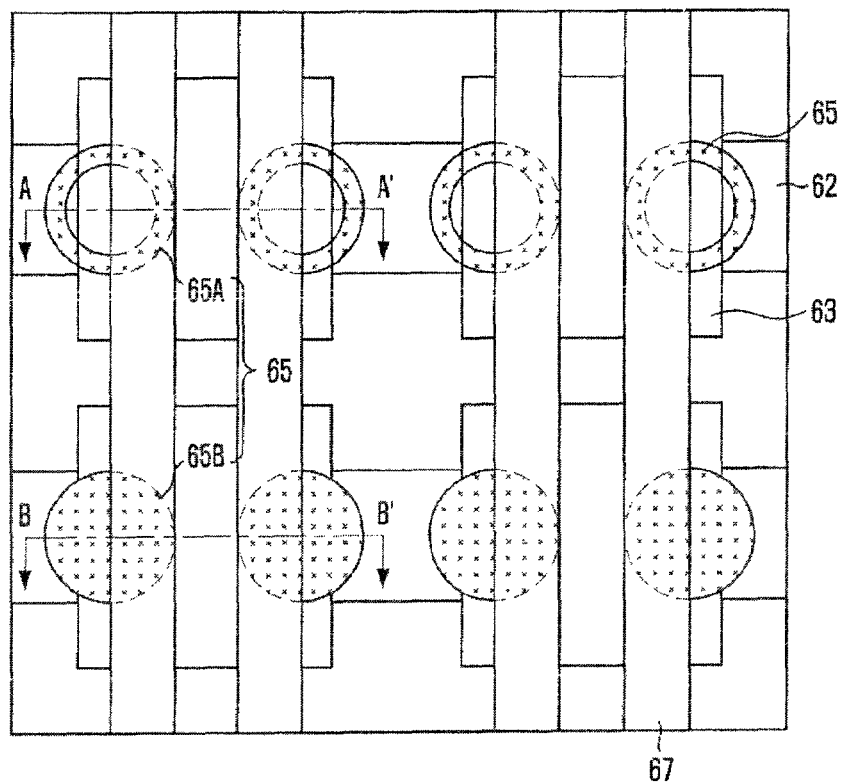
FIG. 8A is a schematic plan view of a phase-change memory device in accordance with a fourth embodiment.
Figure 8B:
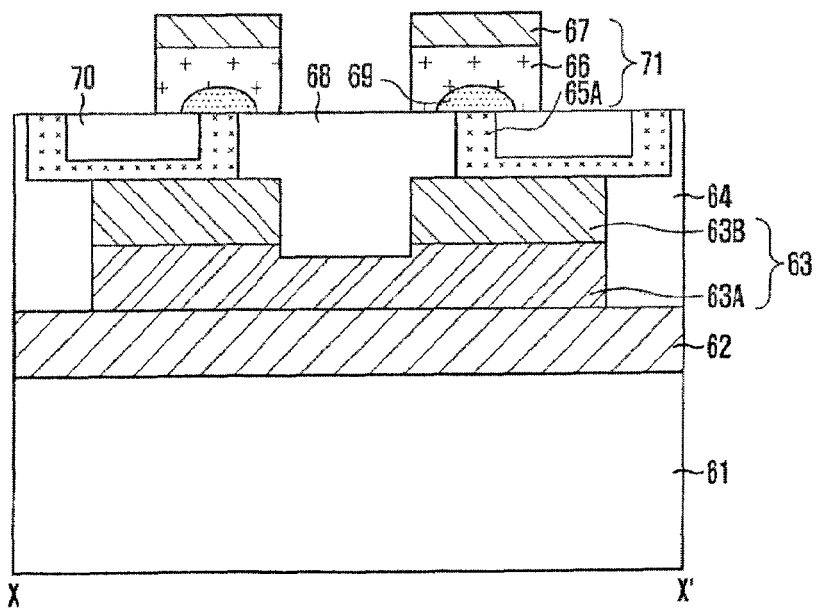
FIG. 8B is a cross-sectional view of the phase-change memory device taken along line A-A' of FIG. 8A.
Figure 8C:
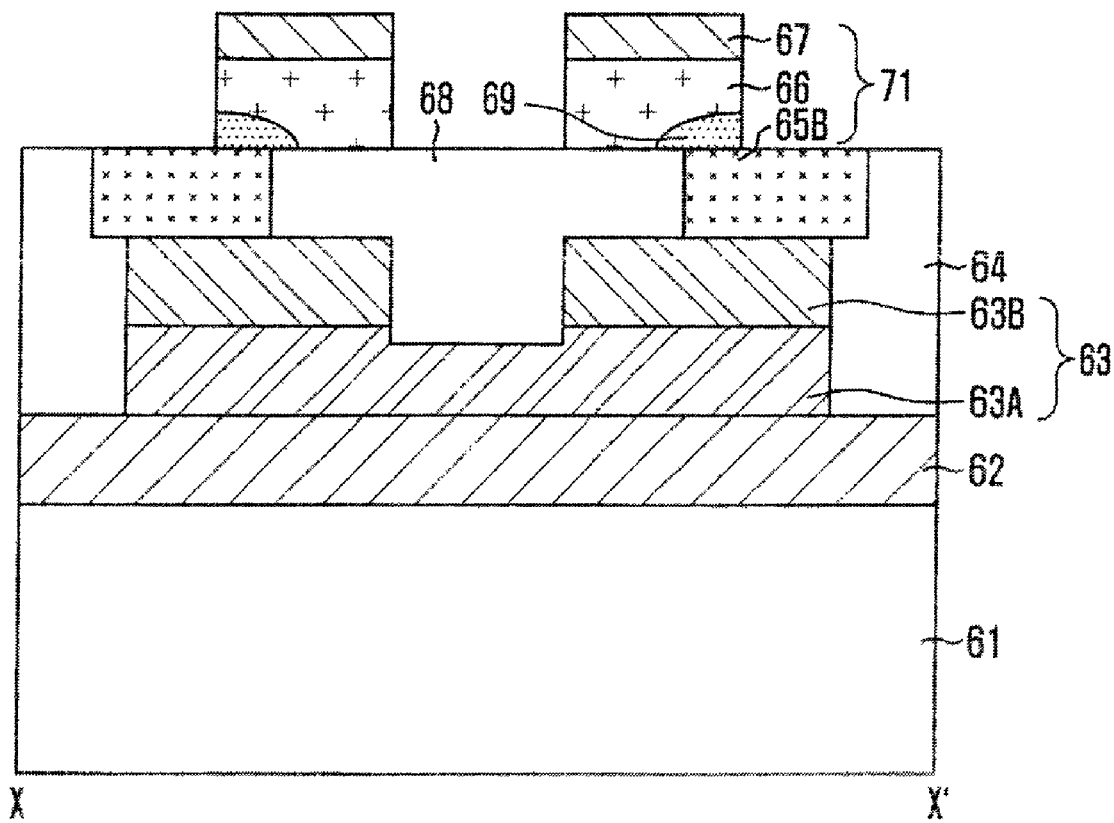
FIG. 8C is a cross-sectional view of the phase-change memory device taken along line B-B' of FIG. 8A.

FIG. 8A is a schematic plan view of a phase-change memory device in accordance with a fourth embodiment. FIG. 8B is a cross-sectional view of the phase-change memory device taken along line A-A' of FIG. 8A. FIG. 8C is a cross-sectional view of the phase-change memory device taken along line B-B' of FIG. 8A.

Referring to FIGS. 8A to 8C, a phase-change memory device in accordance with a fourth embodiment includes a substrate 61 having a device isolation region and an active region 62, a first insulating layer 64 covering the substrate 61, a lower electrode 63 disposed on the active region 62 and having a shared region and multiple isolated regions, and multiple phase-change memory cells 71 each disposed on one of the isolated regions. Each phase-change memory cell 71 includes a heating layer 65 disposed on the respective isolated region, a phase-change material layer 66 disposed on the heating layer 65 and an upper electrode 67 disposed on the phase-change material layer 66. The phase-change memory device may further include a second insulating layer 68 buried between the isolated regions of the lower electrode 63 and the heating layer 65. A reference numeral 69 denotes a program region that is disposed in the phase-change material layer 66.

The shared region in the lower electrode 63 is formed of an N-type conductive layer 63A, and each isolated region in the lower electrode 63 is formed of a junction of a P-type conductive region 63B and the N-type conductive layer 63A. That is, the lower electrode 63 includes multiple PN diodes each of which has a junction of the N-type conductive layer 63A and the P-type conductive layer 63B, and multiple phase-change memory cells 71 share the N-type conductive layer 63A. The P-type conductive layer 63B is electrically connected with the respective phase-change memory cell 71.

The heating layer 65 may be formed of a cup-shaped heating layer 65A or a plug-type heating layer 65B or a cylindrical heating layer (not shown) as discussed with respect to FIGS. 6A and 6B. If the heating layer 65 is formed of the cup-shaped or cylindrical heating layer 65A, the phase-change memory device may further include a third insulating layer 70 that fills an empty space in the heating layer 65A. The third insulating layer 70 may be formed of the same material as the first insulating layer 64 and the second insulating layer 68. That is, the third insulating layer 70 may be formed of at least one selected from the group consisting of an oxide layer, a nitride layer, an oxynitride layer, and a stack thereof.

The phase-change material layer 66 may be formed to cover the entire heating layer 65, or may be formed to cover only a portion of the heating layer 65 in order to further reduce the contact area between the phase-change material layer 66 and the heating layer 65.

In the description above, multiple, at least two, phase-change memory cells 71 share one lower electrode 63 in the phase-change memory device in accordance with the fourth embodiment, thus making it possible to considerably increase the integration ratio of the phase-change memory device. That is, the fourth embodiment can increase the integration ratio of the phase-change memory device two or more times in comparison with the first and second embodiments.

Also, the fourth embodiment can increase the integration ratio of the phase-change memory device and can also reduce the contact area between the phase-change material layer 66 and the heating layer 65, thereby making it possible to reduce the required operation current of the phase-change memory device.

A method of fabricating the phase-change memory devices in accordance with the fourth embodiment can be easily derived from the method(s) of fabricating the phase-change memory devices in accordance with the first and/or second and/or third embodiments, and thus its detailed description will be omitted for conciseness.

In the phase-change memory devices in accordance with the third and fourth embodiments, the two or more adjacent phase-change memory cells (i.e., the structures including the heating layer, the phase-change material layer, and the upper electrode) do not interfere with each other although they share one lower electrode. This will be described with reference to FIG. 9.

Figure 9:
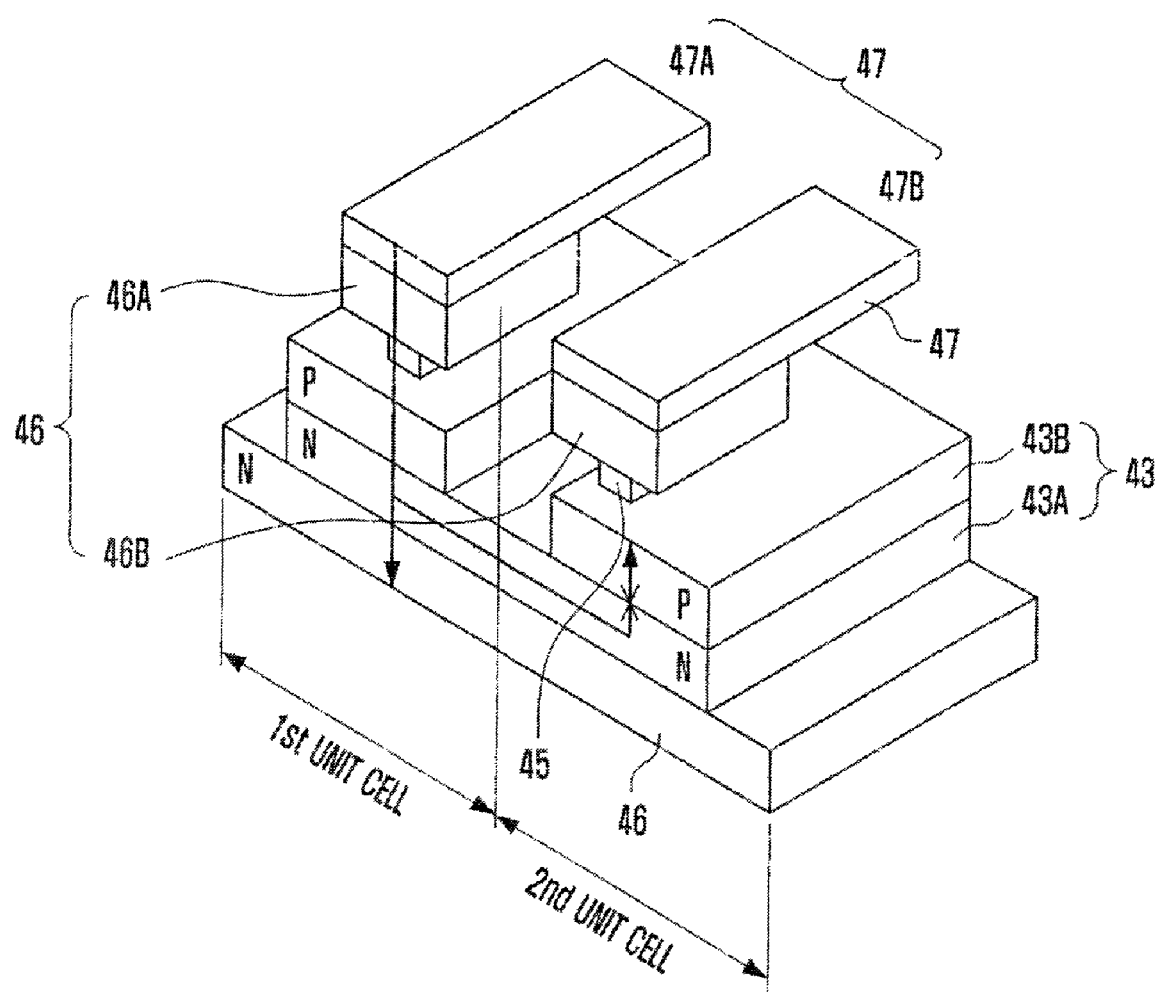
FIG. 9 is a perspective view for describing the operation principles of the phase-change memory devices in accordance with the third and fourth embodiments.

FIG. 9 is a perspective view for describing the operation principles of the phase-change memory devices in accordance with the third and fourth embodiments. FIG. 9 illustrates the phase-change memory device in accordance with the third embodiment, and it is assumed that the active region 42 acts as a word line and the upper electrode 47 acts as a bit line although the roles of the active region 42 and the upper electrode 47 can be reversed.

Referring to FIG. 9, a word line signal, for example, a first voltage is applied to the active region 42 and simultaneously a bit line signal, for example, a second voltage is applied to a first upper electrode 47A in order to write data in a phase-change material layer 46A of a first unit cell. If the second voltage is higher than the first voltage, the lower electrode 43 (i.e., the first PN diode) of the first unit cell has a forward state and thus an operation current flows from the first upper electrode 47A to the active region 42. At this point, heat is generated at the heating layer 45 by the operation current, and the phase-change material layer 46A of the first unit cell changes into one of an amorphous phase or a crystalline phase depending on the intensity and duration of the generated heat.

Because the first unit cell and the second unit cell share the N-type conductive layer 43A of the lower electrode 43, that is, because the first unit cell and a second unit cell are electrically connected to each other, an operation current applied to the first unit cell can flow through the N-type conductive layer 43A to the second unit cell. However, the operation current cannot flow to a second upper electrode 47B to change the phase-change material layer 46B of the second unit cell. The reason for this is that the operation current applied to the first unit cell is a reverse state in the lower electrode 43 of the second unit cell. That is, the operation current cannot flow in the second unit cell because a reverse bias is applied to the second PN diode.

In summary, although two or more adjacent phase-change memory cells share one lower electrode in the phase-change memory device in accordance with the third and fourth embodiments, they do not interfere with each other.

As described above, the heating layer is formed in the phase-change memory device so that it is possible to effectively reduce the contact area between the phase-change material layer and the heating layer.

Also, the phase-change material layer in some embodiments is formed to cover only a portion of the heating layer, thereby making it possible to further reduce the contact area between the phase-change material layer and the heating layer.

Accordingly, the contact area between the phase-change material layer and the heating layer can be reduced without having to use an expensive fine patterning technology (although such technology can still be used in some embodiments if desirable), thereby making it possible to reduce the fabrication cost of the phase-change memory device.

Also, two or more phase-change memory cells can share one lower electrode, thereby making it possible to considerably increase the integration ratio of the phase-change memory device.

Consequently, it is possible to reduce the required operation current of the phase-change memory device while increasing the integration ratio of the phase-change memory device.

While specific embodiments have been described, it will be apparent to those skilled in the art that various changes and modifications may be made.

What is claimed is:

1. A phase-change memory device, comprising:
    a lower electrode; and
    at least two phase-change memory cells sharing the lower electrode,
    wherein
    each of the phase-change memory cells comprises:
        a heating layer disposed on the respective isolated region;
        a phase-change material layer disposed on the heating layer; and
        an upper electrode disposed on the phase-change material layer,
    the heating layer is formed in one of a plug type, a cup type and a cylinder type, and
    the phase-change material layer covers only a portion of the heating layer.

2. The phase-change memory device of claim 1, wherein the lower electrode comprises a shared region and at least two isolated regions each connected to one of the at least two phase-change memory cells.

3. The phase-change memory device of claim 2, wherein
    each of the isolated regions comprises a PN diode structure including a P-type conductive layer and a N-type conductive layer; and
    the shared region includes only one of said P-type and N-type conductive layers.

4. The phase-change memory device of claim 3, wherein
    the shared region includes only the N-type conductive layer, and
    the P-type conductive layer in each of the at least two phase-change memory cells is separated from the P-type conductive layer in the other phase-change memory cell.

5. The phase-change memory device of claim 3, wherein each of the N-type conductive layer and the P-type conductive layer comprises a silicon layer.

* * * * *